United States Patent
Zhang et al.

(10) Patent No.: US 12,230,004 B2
(45) Date of Patent: Feb. 18, 2025

(54) METHOD AND APPARATUS FOR PROCESSING A POINT CLOUD

(71) Applicants: BEIJING XIAOMI MOBILE SOFTWARE CO., LTD., Beijing (CN); XIDIAN UNIVERSITY, Shaanxi (CN)

(72) Inventors: Wei Zhang, Shaanxi (CN); Mary-Luc Georges Henry Champel, Beijing (CN)

(73) Assignees: BEIJING XIAOMI MOBILE SOFTWARE CO., LTD., Beijing (CN); XIDIAN UNIVERSITY, Shaanxi (CN)

( * ) Notice: Subject to any disclaimer, the term of this patent is extended or adjusted under 35 U.S.C. 154(b) by 364 days.

(21) Appl. No.: 17/919,136

(22) PCT Filed: Apr. 14, 2020

(86) PCT No.: PCT/CN2020/084804
§ 371 (c)(1),
(2) Date: Oct. 14, 2022

(87) PCT Pub. No.: WO2021/207947
PCT Pub. Date: Oct. 21, 2021

(65) Prior Publication Data
US 2023/0162402 A1    May 25, 2023

(51) Int. Cl.
*G06T 9/00*   (2006.01)
*G06T 9/40*   (2006.01)

(52) U.S. Cl.
CPC ............... *G06T 9/001* (2013.01); *G06T 9/40* (2013.01)

(58) Field of Classification Search
None
See application file for complete search history.

(56) References Cited

U.S. PATENT DOCUMENTS 10,693,492 B1 *   6/2020   Lasserre ................. G06T 9/001
10,992,947 B2 *   4/2021   Lasserre ............. H04N 19/597
(Continued)

FOREIGN PATENT DOCUMENTS

EP            3514966 A1       7/2019
WO    WO-2019140508 A1 *   7/2019   ............... G06T 9/00

OTHER PUBLICATIONS

PCT/CN2020/084804 International Search Report dated Jan. 13, 2021; 2 pages.

*Primary Examiner* — Anand P Bhatnagar
(74) *Attorney, Agent, or Firm* — Cozen O'Connor

(57) ABSTRACT

A method for encoding and decoding, an encoder and decoder for a point cloud. The method for encoding a point cloud to generate a bitstream of compressed point cloud data, in which the point cloud's geometry is represented by an octree-based structure with a plurality of nodes having parent-child relationships by recursively splitting a volumetric space containing the point cloud into sub-volumes each associated with a node of the octree-based structure, includes: determining an occupancy pattern for a parent node based on the occupancy of its child nodes; determining a planar context information for at least one of the child nodes; and entropy encoding/decoding the occupancy pattern parent node based on the determined planar context information to produce encoded/decoded data for the bitstream.

18 Claims, 10 Drawing Sheets

(56) References Cited

U.S. PATENT DOCUMENTS

| | | | | |
|---|---|---|---|---|
| 11,206,426 B2* | 12/2021 | Sugio | .................... | H04N 19/105 |
| 2020/0413080 A1* | 12/2020 | Lasserre | ................ | H04N 19/91 |
| 2021/0104077 A1* | 4/2021 | Zakharchenko | ........ | G06T 9/001 |
| 2022/0353549 A1* | 11/2022 | Lasserre | ............... | H04N 19/167 |
| 2023/0046917 A1* | 2/2023 | Flynn | .................... | H04N 19/96 |

* cited by examiner

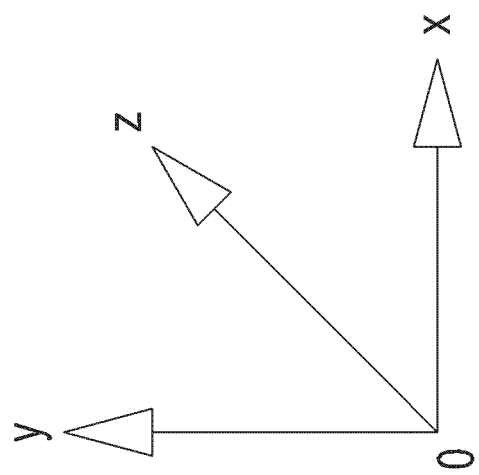
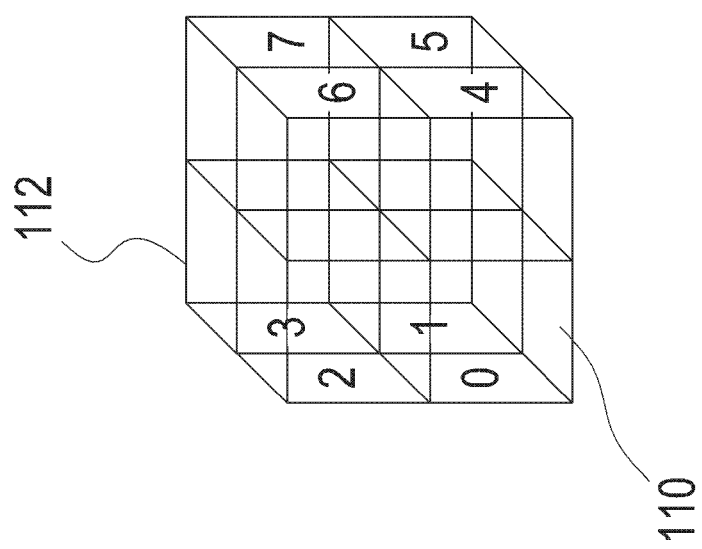
Fig. 4

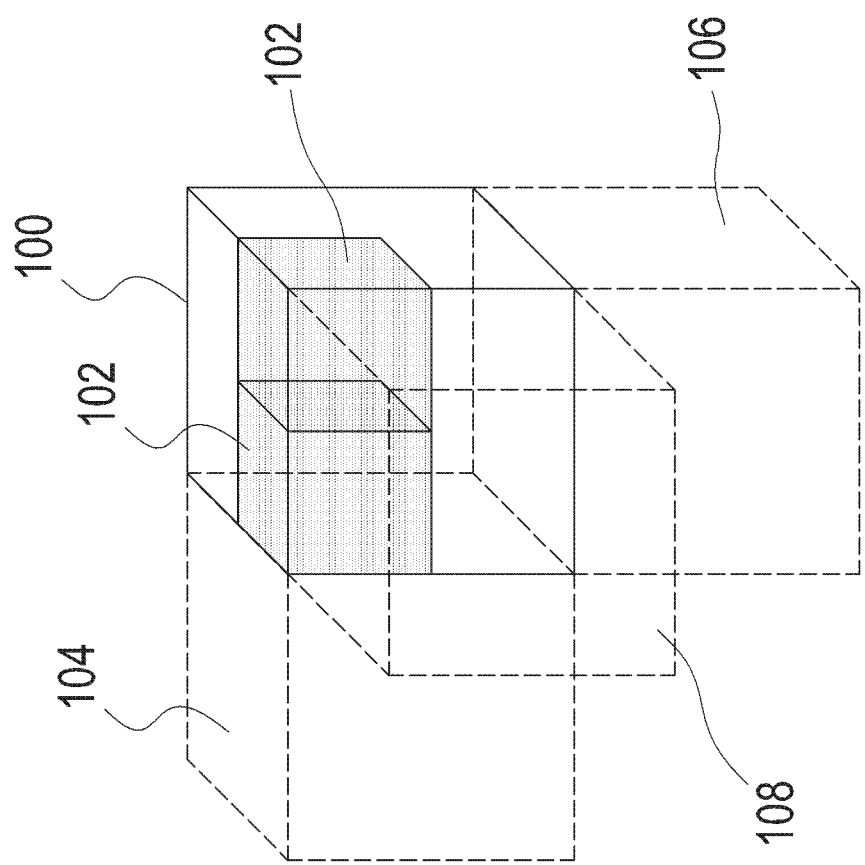
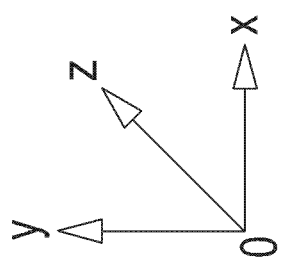
Fig. 5

METHOD AND APPARATUS FOR PROCESSING A POINT CLOUD

CROSS-REFERENCE TO RELATED APPLICATION

This application is a U.S. national phase of International Application No. PCT/CN2020/084804, filed with the State Intellectual Property Office of P. R. China on Apr. 14, 2020.

FIELD

The present application generally relates to point cloud compression. More specifically, the present application relates to a method of encoding and decoding as well as an encoder and decoder for improved entropy coding of point clouds.

BACKGROUND

As an alternative to 3D meshes, 3D point clouds have recently emerged as a popular representation of 3D media information. Use cases associated with point cloud data are very diverse and include:
- 3D assets in movie production,
- 3D assets for real-time 3D immersive telepresence or VR applications,
- 3D free viewpoint video (for instance for sports viewing),
- Geographical Information Systems (cartography),
- Culture heritage (storage of fragile assets in digital form),
- Autonomous driving (large scale 3D mapping of environment) . . . .

A point cloud is a set of points in a 3D space, each with associated attributes, e.g. color, material properties, etc. Point clouds can be used to reconstruct an object or a scene as a composition of such points. They can be captured using multiple cameras and depth sensors in various setups and may be made up of thousands up to billions of points in order to realistically represent reconstructed scenes.

For each points of a point cloud, its position (usually an X, Y, Z information coded as a floating point with 32 or 64 bits) and its attributes (usually at least an RGB color coded in 24 bits) need to be stored. With sometimes billions of points in a point cloud, one can easily understand that the raw data of a point cloud can be several Gigabytes of data: hence, there is a strong need for compression technologies so as to reduce the amount of data required to represent a point cloud.

Two different approaches were developed for point cloud compression:

First, in the Video based Point Cloud Compression (VPCC) approach, a point cloud is compressed by performing multiple projections of it on the 3 different axis X, Y, Z and on different depths so that all points are present in one projected image. Then the projected images are processed into patches (to eliminate redundancy) and re-arranged into a final picture where additional metadata is used to translate pixels positions into point positions in space. The compression is then performed using traditional image/video MPEG encoders. The advantage of this approach is that it reuses existing coders and it naturally supports dynamic point clouds (using video coders) but this is hardly usable for scarce point clouds and it is expected that the compression gain would be higher with point clouds dedicated methods.

Second, in the Geometry based Point Cloud Compression (GPCC) approach, points positions (usually referred to as the geometry) and points attributes (color, transparency . . . ) are coded separately. In order to code the geometry, an octree structure is used. The whole point cloud is fitted into a cube which is continuously split into eight sub-cubes until each of the sub-cubes contains only a single point. The position of the points is therefore replaced by a tree of occupancy information at every node. Since each cube has only 8 sub-cubes, 3 bits are enough to code the occupancy and therefore for a tree of depth D, $3^D$ bits are needed to code the position of a point. While this transformation alone is not enough to provide significant compression gain, it should be noted that since it is a tree, many points share the same node values and thanks to the use of entropy coders, the amount of information can be significantly reduced.

Thus, it is an object of the present invention to provide an encoding and decoding method as well as an encoder and decoder enabling improved quick and accurate data compression of point clouds.

SUMMARY

In an aspect of the present invention, a method for encoding a point cloud is provided to generate a bitstream of compressed point cloud data, in which the point cloud's geometry is represented by an octree-based structure with a plurality of nodes having parent-child relationships by recursively splitting a volumetric space containing the point cloud into sub-volumes each associated with a node of the octree-based structure; the method includes the steps of: determining an occupancy pattern for a parent node based on the occupancy of its child nodes;
- determining a planar context information for at least one of the child nodes, in which the planar context information of a present child node is determined according to the occupancy pattern of the present parent node and the occupancy pattern of at least one neighboring parent node positioned directly next to the present parent node; and
- entropy encoding the occupancy pattern of the parent node based on the determined planar context information to produce encoded data for the bitstream.

In an aspect of the present invention a method for decoding a bitstream of compressed point cloud data is provided to generate a reconstructed point cloud, in which the point cloud's geometry is represented by an octree-based structure with a plurality of nodes having parent-child relationships by recursively splitting a volumetric space containing the point cloud into sub-volumes each associated with a node of the octree-bases structure, the method includes the steps of: entropy decoding the bitstream based on the planar context information of the present child node, in which the planar context information of the present child node is determined according to the occupancy pattern of the present parent node and the occupancy pattern of at least one neighboring parent node positioned directly next to the present parent node.

In an aspect of the present invention, an encoder is provided for encoding a point cloud to generate a bitstream of compressed point cloud data, in which the point cloud's geometry is represented by an octree-based structure with a plurality of nodes having parent-child relationships by recursively splitting a volumetric space containing the point cloud into sub-volumes each associated with a node of the octree-based structure, the encoder including:
- a processor and
- a memory storage device, in which in the memory storage device instructions executable by the processor are stored that, when executed, cause the processor to perform the method according to the above-described methods for encoding and decoding.

In an aspect of the present invention, a decoder is provided for decoding a bitstream of compressed point cloud data to generate a reconstructed point cloud, in which the point cloud's geometry is represented by an octree-based structure with a plurality of nodes having parent-child relationships by recursively splitting a volumetric space containing the point cloud into sub-volumes each associated with a node of the octree-bases structure, the decoder including:

a processor and a memory storage device, in which in the memory storage device instructions executable by the processor are stored that, when executed, cause the processor to perform the above-described method of decoding.

In an aspect of the present invention a non-transitory computer-readable storage medium is provided storing processor-executed instructions that, when executed by a processor, cause the processor to perform the above-described method of encoding and/or decoding.

BRIEF DESCRIPTION OF THE DRAWINGS

Reference will now be made, by way of example, to the accompanying drawings which show example embodiments of the present application, and in which the Figures show:

FIG. 4 numbering of the eight sub-nodes in each node,

FIG. 5 neighbors of a node with known occupancy information,

DETAILED DESCRIPTION OF THE DRAWINGS

Figure 1:
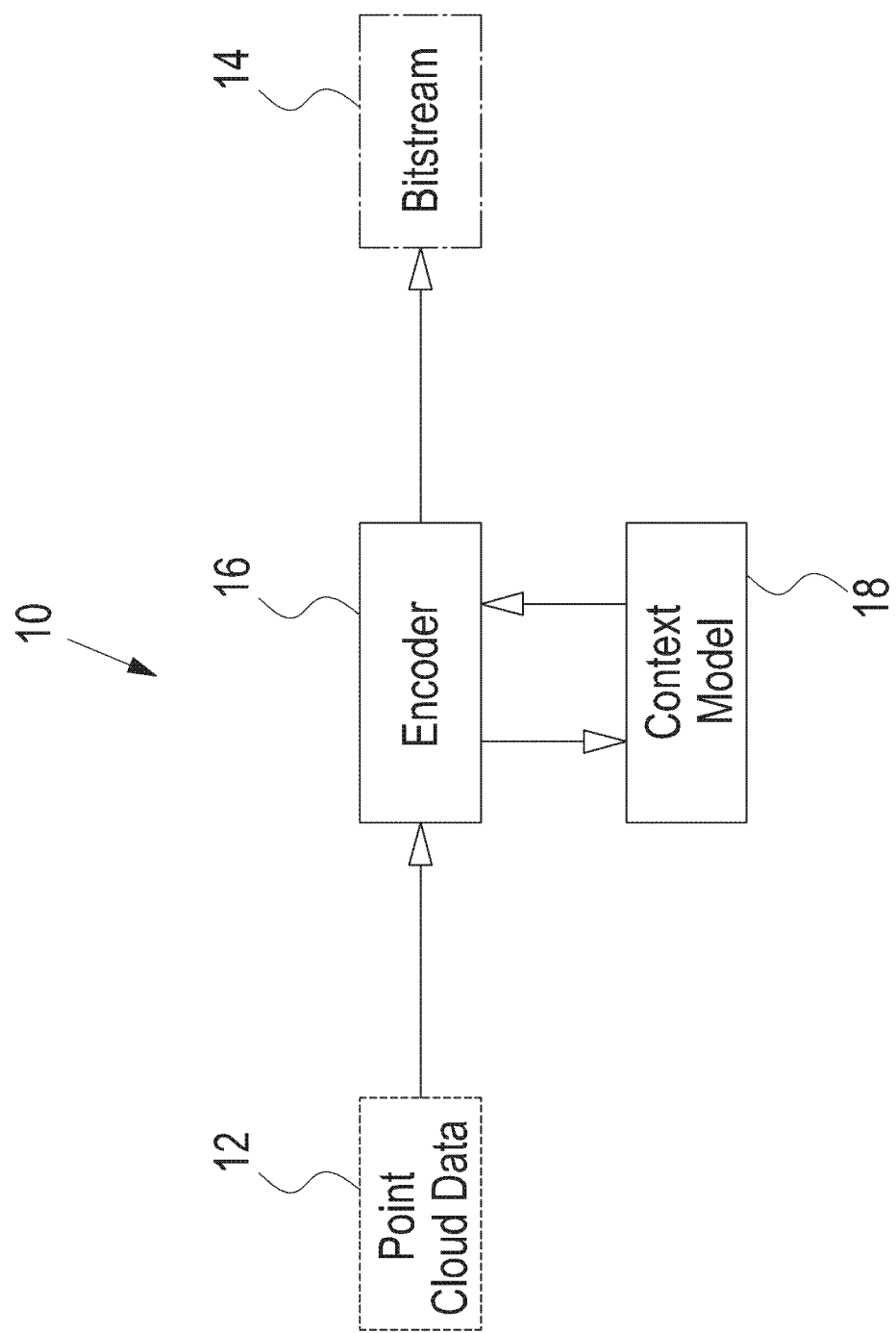
FIG. 1 a block diagram showing a general view of the point cloud encoder.

The present application describes methods of encoding and decoding point clouds, and encoders and decoders for encoding and decoding point clouds. A present parent node associated with a sub-volume is split into further sub-volumes, each further sub-volume corresponding to a child node of the present parent node, and, at the encoder, an occupancy pattern is determined for the present parent node based on occupancy status of the child nodes. A planar context information is determined from the occupancy pattern of the present parent node and an occupancy pattern of a neighboring parent node positioned directly next to the present parent node. The entropy encoder encodes the occupancy pattern based on the determined planar context information to produce encoded data for the bitstream. The decoder determines the same planar context information and entropy decodes the bitstream to reconstruct the occupancy pattern.

In an aspect of the present invention, a method for encoding a point cloud is provided to generate a bitstream of compressed point cloud data, in which the point cloud's geometry is represented by an octree-based structure with a plurality of nodes having parent-child relationships by recursively splitting a volumetric space containing the point cloud into sub-volumes each associated with a node of the octree-based structure; the method includes the steps of: determining an occupancy pattern for a parent node based on the occupancy of its child nodes;

determining a planar context information for at least one of the child nodes, in which the planar context information of a present child node is determined according to the occupancy pattern of the present parent node and the occupancy pattern of at least one neighboring parent node positioned directly next to the present parent node; and entropy encoding the occupancy pattern of the parent node based on the determined planar context information to produce encoded data for the bitstream.

Therein, the present parent node and the neighboring parent node are on the same depth D of the tree. Due to their position, the present parent node and the neighboring parent node share a common surface. For the current child node, being a direct child of the present parent node at depth D+1 of the tree, the planar context information is determined in dependence on the occupancy pattern of the present parent node and the at least one neighboring parent node. Therein, the planar context information includes information about a possible plane or surface represented by the point cloud going through the current child node. Thus, information about the occupancy of at least one direct neighbor of the present parent node is considered as context information for the entropy encoding. As a consequence, more reliable predictions about occupancy of the current child node can be made which can be used for increased data reduction by the entropy encoder. In this manner, the complete tree is traversed to determine an occupancy pattern for each node and provides sufficient context information for the entropy encoder.

Preferably, the neighboring parent node is the node directly next to the present child node, sharing one surface with the present child node.

Preferably, the neighboring parent node is arranged along one of the geometrical axes. If planar context information is evaluated along one of the geometrical axes—X, Y, Z—then the neighboring parent node is arranged along this specific axis directly before or directly after the present parent node.

Preferably, the planar context information is determined along all three geometrical axes. Thus, planes or surfaces represented by the points of the point cloud are evaluated along each axis.

Preferably, the present parent node is arranged relatively to the neighboring parent node in order of decoding. During decoding, the nodes of the octree-based structure are successively evaluated. Thus, information about occupancy patterns in the order of decoding before the present parent node is already accessible and thus can be used for determining the planar context information for decoding. In particular, the order of decoding is exactly inverse to the order of encoding. However, during encoding, the exact position of each point in the point cloud is already known.

Preferably, the occupancy pattern for the present child node includes planar information, in which preferably the planar information includes isPlanar information. Therein, the isPlanar information may include an isPlanar-flag indicating that the current child node likely belongs to a surface or plane defined by points of the point cloud. Therein, the isPlanar-flag is binary and indicates the presence of a plane or surface going through the present child node. Further, the planar information includes planePosition information.

Therein, the planePosition information may include a planePosition-flag indicating the position of the plane within the present child node, in particular having the values "high" and "low", thus being also binary. Further, the planar context information for the entropy encoding/decoding of the planar information includes context information indicating the likelihood that the present child node belongs to a surface defined by points of the point cloud and the likely position of the plane within the present child node.

Preferably, the planar context information is determined according to an occupied status of a first group of four child nodes of the neighboring parent node that are directly next to the present parent node and the occupied status of a second group of four child nodes of the present parent node directly opposite the first group, in which the occupied status is fulfilled if at least one of the child nodes of the first group or second group, respectively, is not empty. In other words, the four child nodes of the first group of the neighboring parent node are directly adjacent to the common surface of the present parent node and the neighboring parent node and the second group is within the present parent node arranged directly adjacent to the opposite side of the present parent node. Each of the groups preferably define a plane by the four child nodes, in which each of the planes is perpendicular to the considered geometrical axis and directly adjacent to the present child node to be evaluated. Thus, sufficient information can be acquired to provide a reliable prediction about the isPlanar and planePosition to be encoded.

Preferably, if the first group is occupied and the second group is not occupied, the planar information are entropy encoded with the planar context information that includes the probability of a "low" plane in the present child node. Indeed, it is likely that the present child node defines a surface represented by the point cloud.

Preferably, if the first group is not occupied and the second group is occupied, the planar information are entropy encoded with the planar context information that includes the probability of a "high" plane in the present child node. Indeed, it is likely that the present child node defines a surface represented by the point cloud.

Preferably, if the first group is occupied and the second group is occupied, the planar information are entropy encoded with the planar context information that includes the probability of no plane in the present child node. Indeed, it is not likely that the present child node defines a surface represented by the point cloud.

Preferably, if the first group is not occupied and the second group is not occupied, the planar information are entropy encoded with the planar context information that includes the probability of no plane in the present child node. Indeed, it is not likely that the present child node defines a surface represented by the point cloud.

In an aspect of the present invention a method for decoding a bitstream of compressed point cloud data is provided to generate a reconstructed point cloud, in which the point cloud's geometry is represented by an octree-based structure with a plurality of nodes having parent-child relationships by recursively splitting a volumetric space containing the point cloud into sub-volumes each associated with a node of the octree-bases structure, the method includes the steps of:
   entropy decoding the bitstream based on the planar context information of the present child node, in which the planar context information of the present child node is determined according to the occupancy pattern of the present parent node and the occupancy pattern of at least one neighboring parent node positioned directly next to the present parent node.

Therein, the present parent node and the neighboring parent node are on the same depth D of the tree. Due to their position, the present parent node and the neighboring parent node share a common surface. For the current child node, being a direct child of the present parent node at depth D+1 of the tree, the planar context information is determined in dependence on the occupancy pattern of the present parent node and the at least one neighboring parent node. Therein, the planar context information includes information about a possible plane or surface represented by the point cloud going through the present child node. Thus, information about the occupancy of at least one direct neighbor of the present parent node is considered as context information for the entropy decoding. As a consequence, more reliable predictions about the occupancy of the present child node can be made which can be used by the entropy decoder. In this manner, the complete tree is traversed to determine an occupancy pattern for each node and determines the complete tree-structure in order to determine the position of the points of the point cloud.

Preferably, the method of decoding is further built according to the features described above with respect to the method for encoding. These features can be freely combined with the method of decoding.

Other aspects and features of the present application will be understood by those of ordinary skill in the art from a review of the following description of examples in conjunction with the accompanying figures.

At times in the description below, the terms "node" and "sub-volume" may be used interchangeably. It will be appreciated that a node is associated with a sub-volume. The node is a particular point on the tree that may be an internal node or a leaf node. The sub-volume is the bounded physical space that the node represents. The term "volume" may be used to refer to the largest bounded space defined for containing the point cloud. The volume is recursively divided into sub-volumes for the purpose of building out a tree-structure of interconnected nodes for coding the point cloud data.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as color, which may also be a three-component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be static point cloud data. The LiDAR-based scanning of an environment for machine-vision purposes may be dynamic in that the point cloud (at least potentially) changes over time, e.g. with each successive scan of a volume. The dynamic point cloud is therefore a time-ordered sequence of point clouds.

Point cloud data may be used in a number of applications, including conservation (scanning of historical or cultural objects), mapping, machine vision (such as autonomous or semi-autonomous cars), and virtual reality systems, to give some examples. Dynamic point cloud data for applications like machine vision can be quite different from static point cloud data like that for conservation purposes. Automotive vision, for example, typically involves relatively small resolution, non-coloured and highly dynamic point clouds obtained through LiDAR (or similar) sensors with a high frequency of capture. The objective of such point clouds is not for human consumption or viewing but rather for machine object detection/classification in a decision process. As an example, typical LiDAR frames contain on the order of tens of thousands of points, whereas high quality virtual reality applications require several millions of points. It may be expected that there will be a demand for higher resolution data over time as computational speed increases and new applications are found.

While point cloud data is useful, a lack of effective and efficient compression, i.e. encoding and decoding processes, may hamper adoption and deployment.

One of the more common mechanisms for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on the resolution of the tree and/or whether there are any points contained in the sub-volume. A leaf node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

Figure 3:
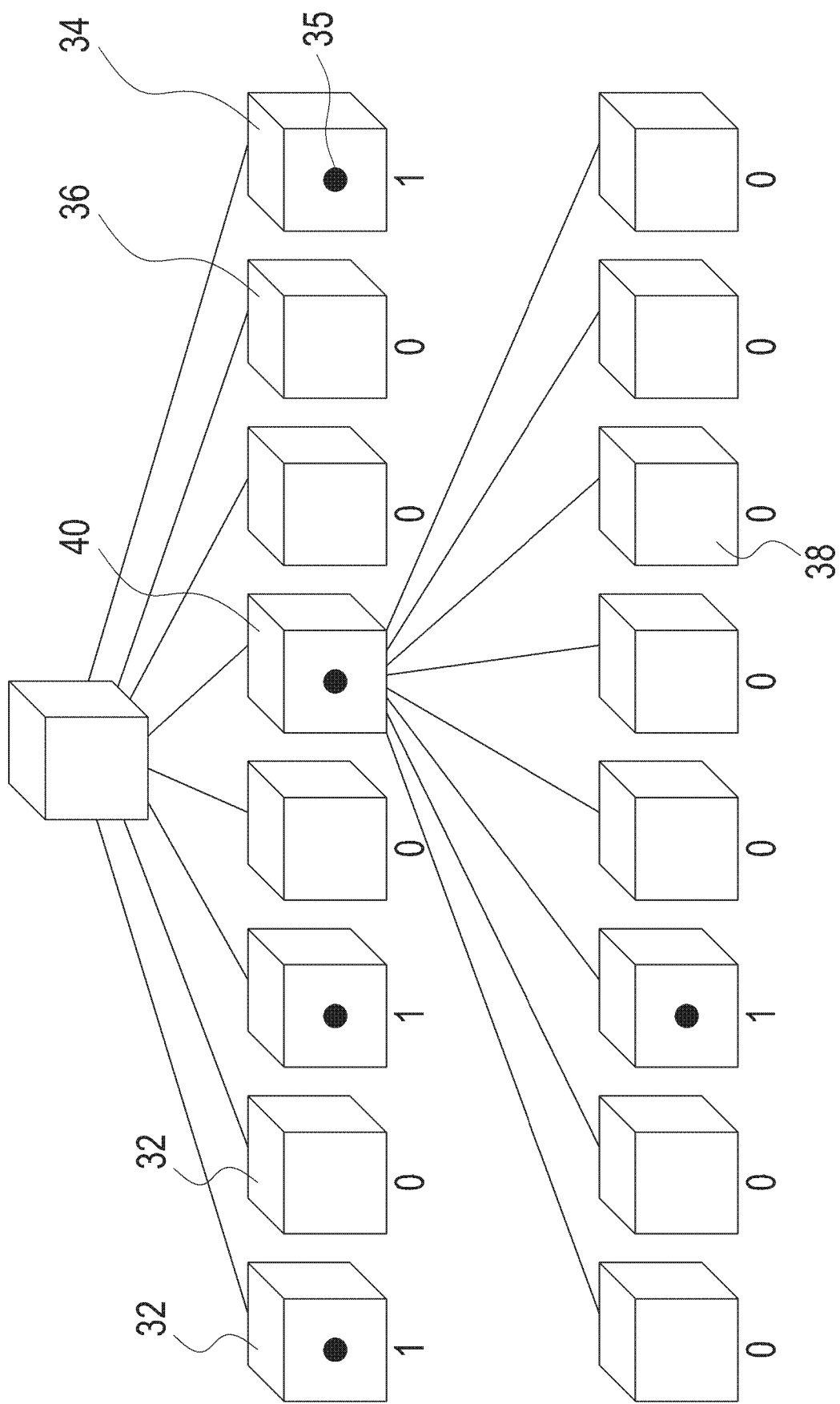
FIG. 3 a schematic illustration of an octree data structure.

A commonly-used tree structure is an octree. In this structure, the volumes/sub-volumes are all cubes and each split of a sub-volume results in eight further sub-volumes/sub-cubes. An example for such a tree-structure is shown in FIG. 3 having a node 30 that might represent the volume containing the complete point cloud. This volume is split into eight sub-volumes 32, each associated with a node in the octree of FIG. 3. Points in the nodes indicate occupied nodes 34 containing at least one point 35 of the point cloud, while empty nodes 36 are representing sub-volumes with no points of the point clouds. As depicted in FIG. 3, occupied nodes might by further split into eight sub-volumes associated with child nodes 38 of a particular parent node 40 in order to determine the occupancy pattern of the parent node 40. As shown in FIG. 3, the occupancy pattern of the exemplified parent node 40 might be represented as "00100000" in a binary form, indicating an occupied third child node 38. In some realizations this occupancy pattern is encoded by a binary entropy encoder to generate a bitstream of the point cloud data.

Reference is now made to FIG. 1, which shows a simplified block diagram of a point cloud encoder 10 in accordance with aspects of the present application. The point cloud encoder 10 receives the point cloud data and might include a tree building module for producing an octree representing the geometry of the volumetric space containing point cloud and indicating the location or position of points from the point cloud in that geometry.

The basic process for creating an octree to code a point cloud may include:
1. Start with a bounding volume (cube) containing the point cloud in a coordinate system;
2. Split the volume into 8 sub-volumes (eight sub-cubes);
3. For each sub-volume, mark the sub-volume with 0 if the sub-volume is empty, or with 1 if there is at least one point in it;
4. For all sub-volumes marked with 1, repeat (2) to split those sub-volumes, until a maximum depth of splitting is reached; and
5. For all leaf sub-volumes (sub-cubes) of maximum depth, mark the leaf cube with 1 if it is non-empty, 0 otherwise.

The tree may be traversed in a pre-defined order (breadth-first or depth-first, and in accordance with a scan pattern/order within each divided sub-volume) to produce a sequence of bits representing the occupancy pattern of each node.

This sequence of bits may then be encoded using an entropy encoder 16 to produce a compressed bitstream 14. The entropy encoder 16 may encode the sequence of bits using a context model 18 that specifies probabilities for coding bits based on a context determination by the entropy encoder 16. The context model 18 may be adaptively updated after coding of each bit or defined set of bits.

Like with video or image coding, point cloud coding can include predictive operations in which efforts are made to predict the pattern for a sub-volume, and the residual from the prediction is coded instead of the pattern itself. Predictions may be spatial (dependent on previously coded sub-volumes in the same point cloud) or temporal (dependent on previously coded point clouds in a time-ordered sequence of point clouds).

Figure 2:
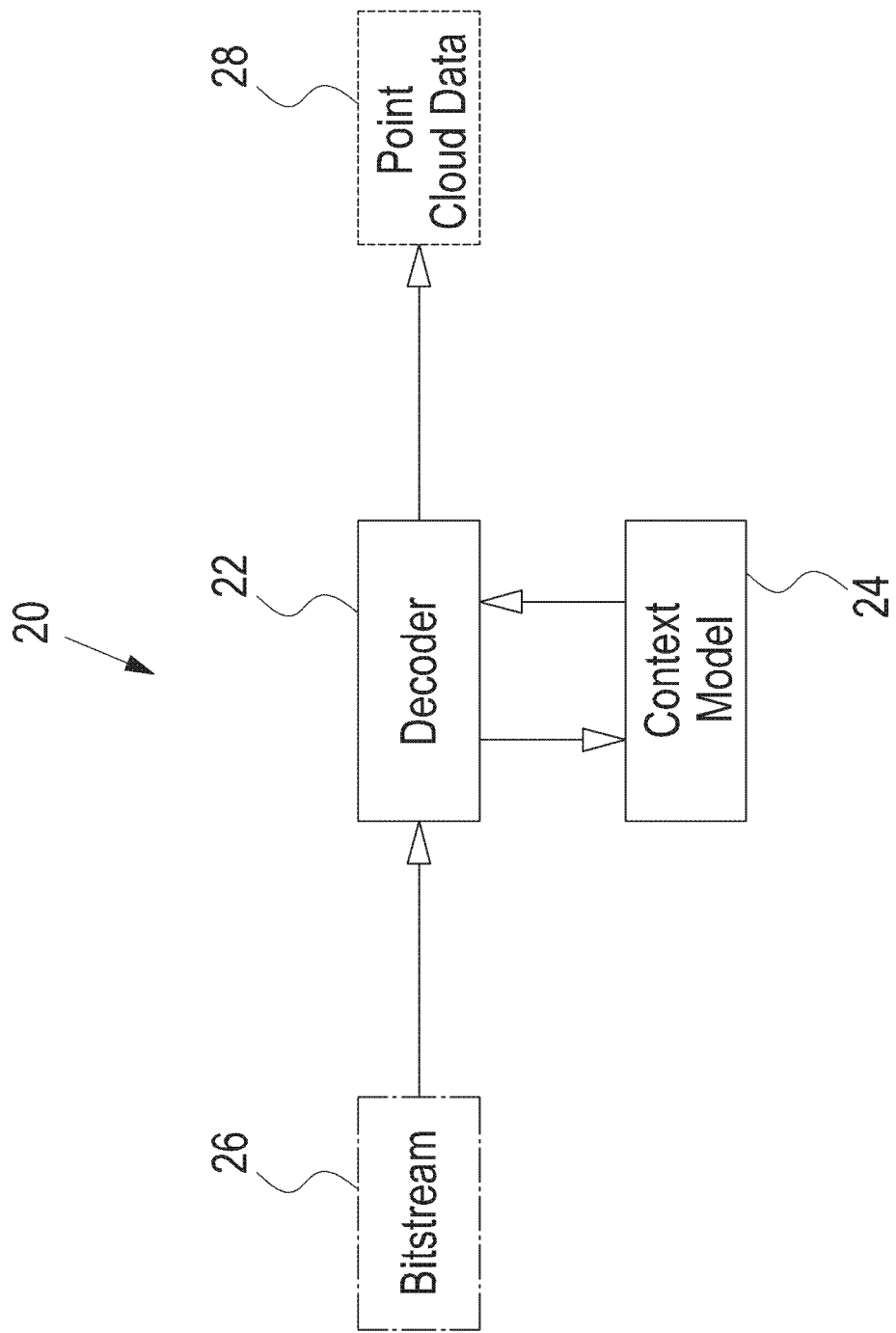
FIG. 2 a block diagram showing a general view of the point cloud decoder.

A block diagram of an example point cloud decoder 20 that corresponds to the encoder 10 is shown in FIG. 2. The point cloud decoder 20 includes an entropy decoder 22 using the same context model 24 used by the encoder 10. The entropy decoder 22 receives the input bitstream 26 of compressed data and entropy decodes the data to produce an output sequence of decompressed bits. The sequence is then converted into reconstructed point cloud data by a tree reconstructor. The tree reconstructor rebuilds the tree structure 28 from the decompressed data and knowledge of the scanning order in which the tree data was binarized. The tree reconstructor is thus able to reconstruct the location of the points from the point cloud.

Therein, the occupancy pattern might include planar information about the probability that a certain node is occupied since the point in this node belongs to a surface. Usually, the real world is dominated by closed surfaces. This is in particular true for indoor rooms but also for urban outdoor scenes. This fact is used by the entropy encoder and decoder. If a surface represented by the point cloud can be detected, predictions about the distribution of point on this surface can be made and thus a probability for the occupancy of a certain node belonging to this surface can be made. This might be done by defining an isPlanar-flag that will be encoded in the bitstream. The isPlanar-flag is usually a binary value wherein a set isPlanar-flag (isPlanar=1) for a certain node is interpreted that there is a prevailing likelihood that this node belongs to a certain surface. In addition to the mere fact of the presence of a surface in a node, further planar information might be considered such as planePosition-flag indicating the position of the plane within the present child node. planePosition-flag might also be a binary value, having the values "high" and "low" referring to the respective position. This planar information is encoded to the bitstream by usage of the planar context information by the entropy encoder/decoder thereby reducing the data of the bitstream.

Referring to FIG. 4, showing a parent node 112 split into its eight child nodes 110 being 2×2×2 cubes with each having the same size and with an edge length being half the edge length of the cube associated with the parent node 112. Further, FIG. 4 indicates the used numbering of the child nodes 110 within a parent node 112. The numbering system shown in FIG. 4 will be used in the further explanation.

Therein, FIG. 4 also indicates the spatial orientation of the shown parent node 112 in the three-dimensional space indicated by the geometrical axis X, Y, Z.

Now referring to FIG. 5 showing a present parent node 100 with two child nodes 102 exemplified as occupied nodes, i.e. the sub-volumes of the two child nodes contain each at least one point of the point cloud. Further, indicated in FIG. 5 are neighboring parent nodes 104, 106, 108. Therein, prior to predicting the planar context information of the child nodes 102 at a certain octree-level, occupation information of the three adjacent neighboring parent nodes 104, 106, 108 at the same level D as the present parent node 100 is known at the decoder side. Due to the given decoding order, upon evaluating the child node 102 of the present parent node 100 information about the neighboring parent nodes 104, 108, 106 are already known at the decoder side and can be used to determine the planar context information. Since these three neighboring parent nodes 104, 106, 108 are adjacent to the present child node 102, there exists a correlation between the occupancy of these neighboring parent nodes 104, 106, 108 and the present child node 102. This information is easy to obtain but currently not used in existing encoding and decoding methods. For example, if evaluating the planar context information of the present child node 102 along the X-axis, the directly adjacent neighboring parent node 104 along the X-axis might be considered. Further, as explained above, the directly adjacent parent node is considered which is in the order of decoding prior to the present parent node. Thus, during decoding the occupancy of the prior nodes are known by the decoder and can be used to determine planar context information. If the planar context information is evaluated along the Y-axis, the neighboring parent node 106 along the Y-axis next to the present parent node 100 is considered in order of decoding. This information is also known to the decoder and can be easily used to acquire reliable planar context information for the present child node 102.

Figure 6:
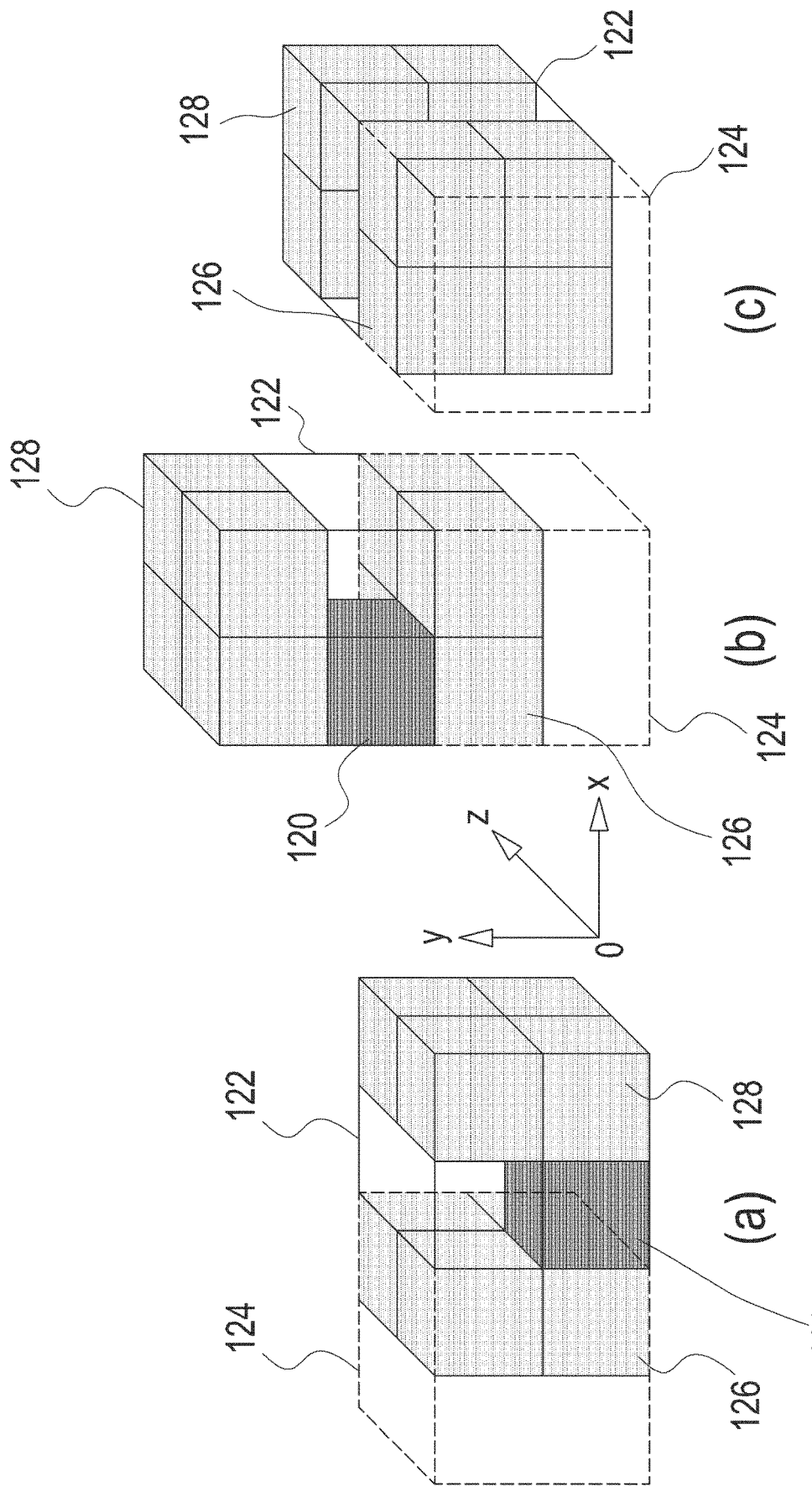
FIG. 6 neighboring nodes used for the three plane directions.

Now referring to FIG. 6 showing the configuration of how to determine planar context information which then can be used in the entropy encoding in order to compress the point cloud data. In this regard, it is an object of the present invention to consider the occupancy of the parent neighbors to the present child node 120 and to incorporate such information in the planar context information when coding the planar information, i.e. the isPlanar-flag or planePosition-flag.

FIG. 6 (a) shows the determination of the planar context information along the X-axis. The planar context information of the present child node 120 shall be evaluated. Therefore, the occupancy of the present parent node 122 as well as the neighboring parent node 123 directly adjacent to the present parent node 122 is evaluated. Therein, the neighboring parent node 124 is arranged along the X-axis which is to be evaluated. Further, the neighboring parent node 124 is arranged prior to the present parent node 122 in order of decoding. Thus, upon decoding the present parent node 122, all information about the neighboring parent node 124 is already available. In addition, also during coding the information of the present child node 120 occupancy information about the neighboring parent node 124 is also known, since positions and thus occupancy pattern of the point cloud is completely known to the encoder.

In particular, in order to determine the planar context information of the present child node 120 a first group 126 of child nodes, being child nodes of the neighboring parent node 124, and a second group 128, being child nodes of the present parent node 122 are considered. Therein, the four child nodes of the first group 126 of the neighboring parent node 124 are directly next and adjacent to the present parent node. Thus, the child nodes of the first group 126 each share a common surface with the present parent node 122. The second group 128 of the four child nodes of the present parent node 122 is directly opposite the first group. Thus, by the four child nodes of the second group 128 a side face of the present parent node 122 is formed which is directly opposite to the side face which is the common surface between the neighboring parent node 124 and the present parent node 122. In other words, by the first group 126 and the second group 128 planes are defined which are on both sides of the present child node 120 and which are perpendicular to the axis under consideration. Thus, by these two planes a reliable determination of the planar context information can be provided. A surface in the point cloud going through the present child node 120 is also highly likely going through one of the planes defined by the first group 126 or the second group 128 and thus the planar context information of the present child node 120 strongly depends on the occupied status of the first group 126 and/or the occupied status of the second group 128. Therein, the first group 126 and the second group 128 are considered "occupied" if at least one child node in the first group and/or second group are not empty and contain a point of the point cloud.

Generally speaking, if the first group is occupied and the second group is not occupied the isPlanar-flag and the planePosition-flag are entropy coded as planar information with a likelihood of a "low" plane in the present child node as planar context information. If the first group is not occupied and the second group is occupied, the isPlanar-flag and the planePosition-flag are entropy coded as planar information with a likelihood of a "high" plane in the present child as planar context information. If the first group is occupied and the second group is occupied, the isPlanar-flag and the planePosition-flag are entropy coded as planar information with a likelihood of no plane in the present child node as planar context information. In this situation it can be assumed that a surface goes through the first group 126 and a second surface goes through the second group 128 rendering it unlikely that in between a further and additional surface is present. Therein, it should be noted that this evaluation is only along one axis. A plane or surface going along the X-axis in the X-Z-plane for example would not be considered during evaluation of the X-axis but during evaluation along the Y-axis for example. If the first group is not occupied and the second group is not occupied, then the isPlanar-flag and the planePosition flag are entropy coded as planar information with a likelihood of no plane in the present child node as planar context information, since it is highly unlikely that an isolated surface is only within the present child node 120.

More specifically speaking, for the evaluation along the X-axis together with the numbering system shown in FIG. 4:

If sub-nodes 4 to 7 of the first group 126 of the neighboring parent node 124 are occupied and sub-nodes 4 to 7 of the present parent node 122 are not occupied, it is strongly likely that there is a plane in the present child node 120 and the plane position is low. Thus, for the coding of the isPlanar and planePosition information, the probability of a "low" plane perpendicular to the X-axis in the present child node is considered as planar context information when performing entropy coding.

If sub-nodes 4 to 7 of the first group 126 of the neighboring parent node 124 are not occupied (i.e., empty)

and sub-nodes 4 to 7 of the present parent node 122 are occupied, it is strongly likely that there is a plane in the present child node 120 and the plane position is high. Thus, for the coding of the isPlanar and planePosition information, the probability of a "high" plane perpendicular to the X-axis in the present child node is considered as planar context information when performing entropy coding.

If sub-nodes 4 to 7 of the first group 126 of the neighboring parent node 124 are occupied and sub-nodes 4 to 7 of the present parent node 122 are occupied, it is strongly likely that current node is not eligible to planar mode. Thus, for the coding of the isPlanar and planePosition information, the probability of an absence of a plane perpendicular to the X-axis in the present child node is considered as planar context information when performing entropy coding.

If sub-nodes 4 to 7 of the first group 126 of the neighboring parent node 124 are not occupied and sub-nodes 4 to 7 of the present parent node 122 are not occupied neither, it is strongly unlikely that current node can be eligible to planar mode. Thus, for the coding of the isPlanar and planePosition information, the probability of an absence of a plane perpendicular to the X-axis in the present child node is considered as planar context information when performing entropy coding.

For evaluating along Y-axis in accordance to FIG. 6 (b) in order to determine the planar context information of the present child node 120 it is set the following:

If sub-nodes 2,3,6,7 of the first group 126 of the neighboring parent node 124 are occupied and sub-nodes 2,3,6,7 of the present parent node 122 are not occupied, it is strongly likely that there is a plane in the present child node 120 and the plane position is low. Thus, for the coding of the isPlanar and planePosition information, the probability of a "low" plane perpendicular to the Y-axis in the present child node is considered as planar context information when performing entropy coding.

If sub-nodes 2,3,6,7 of the first group 126 of the neighboring parent node 124 are not occupied (i.e., empty) and sub-nodes 2,3,6,7 of the present parent node 122 are occupied, it is strongly likely that there is a plane in the present child node 120 and the plane position is high. Thus, for the coding of the isPlanar and planePosition information, the probability of a "high" plane perpendicular to the Y-axis in the present child node is considered as planar context information when performing entropy coding.

If sub-nodes 2,3,6,7 of the first group 126 of the neighboring parent node 124 are occupied and sub-nodes 2,3,6,7 of the present parent node 122 are occupied, it is strongly likely that current node is not eligible to planar mode. Thus, for the coding of the isPlanar and planePosition information, the probability of an absence of a plane perpendicular to the Y-axis in the present child node is considered as planar context information when performing entropy coding.

If sub-nodes 2,3,6,7 of the first group 126 of the neighboring parent node 124 are not occupied and sub-nodes 2,3,6,7 of the present parent node 122 are not occupied neither, it is strongly unlikely that current node can be eligible to planar mode. Thus, for the coding of the isPlanar and planePosition information, the probability of an absence of a plane perpendicular to the Y-axis in the present child node is considered as planar context information when performing entropy coding.

For evaluating along the Z-axis in accordance to FIG. 6 (c) in order to determine the planar context information of the present child node 120 it is set the following:

If sub-nodes 1,3,5,7 of the first group 126 of the neighboring parent node 124 are occupied and sub-nodes 1,3,5,7 of the present parent node 122 are not occupied, it is strongly likely that there is a plane in the present child node 120 and the plane position is low. Thus, for the coding of the isPlanar and planePosition information, the probability of a "low" plane perpendicular to the Z-axis in the present child node is considered as planar context information when performing entropy coding.

If sub-nodes 1,3,5,7 of the first group 126 of the neighboring parent node 124 are not occupied (i.e., empty) and sub-nodes 1,3,5,7 of the present parent node 122 are occupied, it is strongly likely that there is a plane in the present child node 120 and the plane position is high. Thus, for the coding of the isPlanar and planePosition information, the probability of a "high" plane perpendicular to the Z-axis in the present child node is considered as planar context information when performing entropy coding.

If sub-nodes 1,3,5,7 of the first group 126 of the neighboring parent node 124 are occupied and sub-nodes 1,3,5,7 of the present parent node 122 are occupied, it is strongly likely that current node is not eligible to planar mode. Thus, for the coding of the isPlanar and planePosition information, the probability of an absence of a plane perpendicular to the Y-axis in the present child node is considered as planar context information when performing entropy coding.

If sub-nodes 1,3,5,7 of the first group 126 of the neighboring parent node 124 are not occupied and sub-nodes 1,3,5,7 of the present parent node 122 are not occupied neither, it is strongly unlikely that current node can be eligible to planar mode. Thus, for the coding of the isPlanar and planePosition information, the probability of an absence of a plane perpendicular to the Y-axis in the present child node is considered as planar context information when performing entropy coding.

As a summary, in all cases, a reliable planar context information model is established which can be used for the entropic encoding in order to consider the occurrence of a surface or plane in the respective nodes and use this knowledge to validly predict occupancy of nodes for data compression by the entropy encoder/decoder.

In addition to the above described consideration with respect to FIG. 6, the isPlanar-flag might be coded depending on further requirements. These further requirements may include for example: the present parent node 122 of the present child node 120 is considered isPlanar, and the occupancy pattern of the present parent node's neighbor adjacent to the current node in a direction perpendicular to the axis under consideration, i.e. the parent vertical neighbor adjacent to the present parent node 122 for the X-axis, is not empty and a distance d from the closest already coded node at the same coordinate of the axis currently under evaluation at the same depth D within the tree structure is considered as isPlanar. Further requirements may also be added in order to increase the reliability of the planar context information used by the entropic encoder and decoder.

Figure 7:
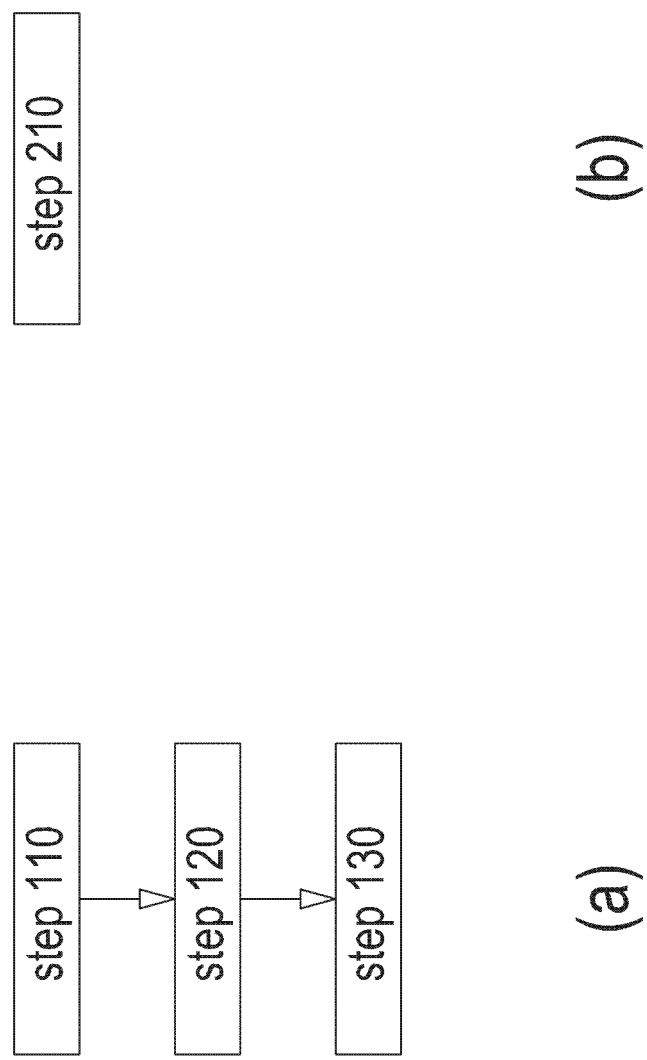
FIG. 7 flow charts illustrating the steps of a first and a second embodiment of the present invention, FIG. 8 a comparison of the current method of encoding and the present invention, FIG. 9 a schematic illustration of an encoder device, and FIG. 10 a schematic illustration of a decoder device.

Referring now to FIG. 7 (a) showing a method for encoding a point cloud including the steps of determining an occupancy pattern for a parent node based on the occupancy of its child nodes (step 110);

Determining a planar context information for at least one of the child nodes, wherein the planar context information of a present child node is determined according to the occupancy pattern of the present parent node and the occupancy pattern of at least one neighboring parent node positioned directly next to the present parent node (step 120); and entropy encoding the occupancy patterned based on the determined planar context information to produce encoded data for its tree (step 130).

Referring now to FIG. 7 (*b*) showing a method for decoding a point cloud including the steps of entropy decoding the bitstream based on the planar context information of the present child node, wherein the planar context information of the present child node is determined according to the occupancy pattern of the present parent node and the occupancy pattern of at least one neighboring parent node positioned directly next to the present parent node (Step 210).

Figure 8:
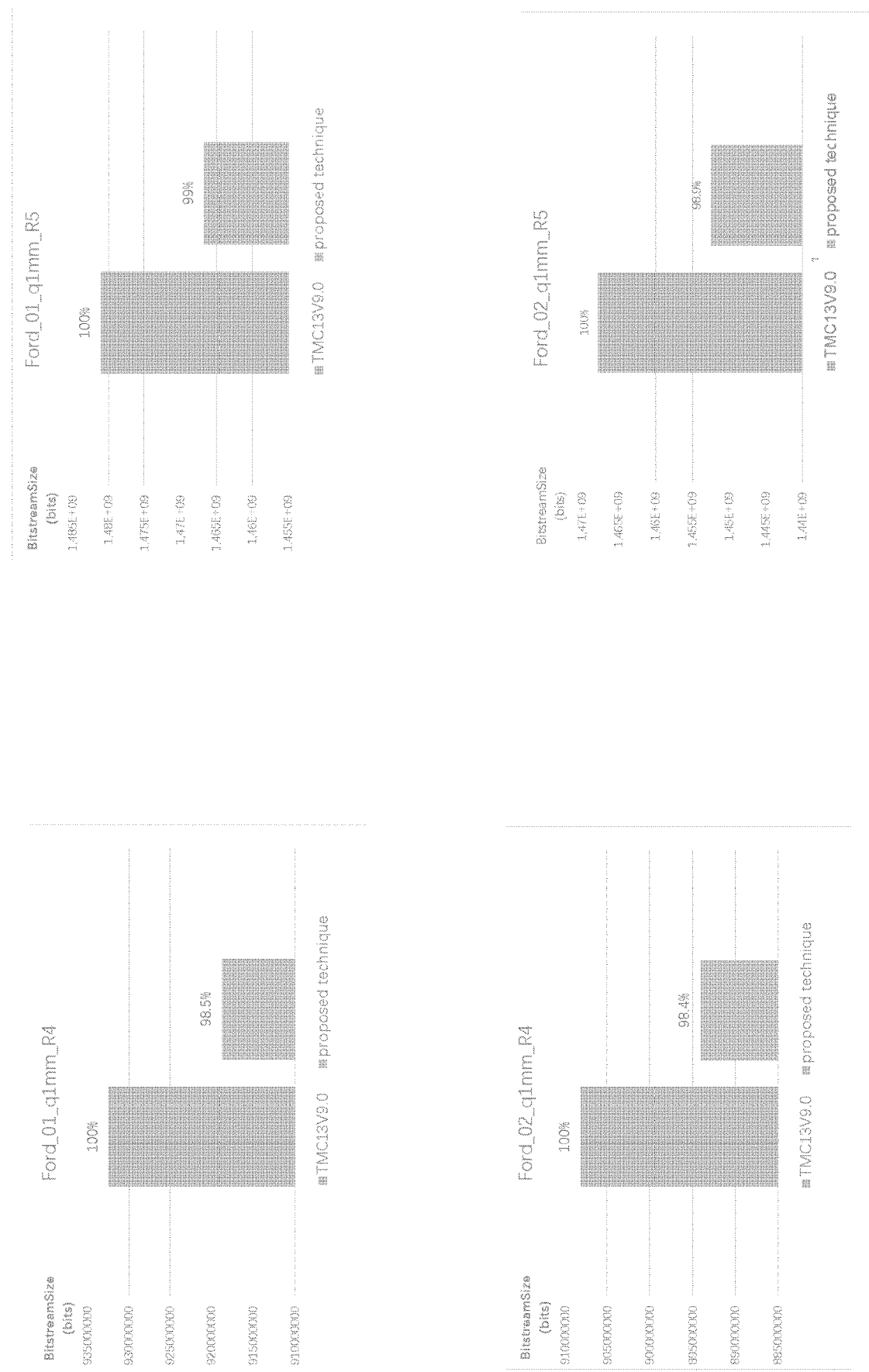

Thus, in accordance to the present invention, information about the neighboring parent node are used and evaluated in order to acquire a planar context information model more reliably predicting the occurrence of a surface within the present child node. This information can be used in order to reduce the amount of data of the compressed point cloud data, wherein the same planar context information model is also used for the decoder in order to be able to reliably decode the provide bitstream with high efficiency and accuracy. Thereby, significant data reduction of at least 1% can be achieved with respect to prior encoding methods. However, this value is dependent on the density of the points wherein in particular for indoor point clouds, such as LiDAR point clouds it is assumed that they can be considered as a dense point cloud. FIG. 8 shows different examples for model sequences wherein the encoded according to the present invention is compared to the TMC13 v.9 encoder (also called G-PCC) of the MPEG-3DG group. As shown data reduction of around 1% can be achieved by the present invention. The quality of the reconstructed point cloud with and without the proposed technique is exactly the same.

In embodiments of the encoding or decoding method, the neighboring parent node is the node directly next to the current child node, sharing one surface with the current child node.

In embodiments of the encoding or decoding method, the neighboring parent node is arranged along one of the geometrical axes.

In embodiments of the encoding or decoding method, the planar context information is determined along all three geometrical axes.

In embodiments of the encoding or decoding method, the present parent node is arranged relatively to the neighboring parent node in order of decoding.

In embodiments of the encoding or decoding method, the occupancy pattern for the present child node includes planar information, wherein preferably the planar information includes isPlanar information and planePosition information, and the planar context information for the entropy encoding/decoding of the planar information includes context information indicating the likelihood that the present child node belongs to a surface defined by points of the point cloud and the likely position of the plane within the present child node.

In embodiments of the encoding or decoding method, the planar context information is determined according to an occupied status of a first group of four child nodes of the neighboring parent node that are directly next to the present parent node and the occupied status of a second group of four child nodes of the present parent node directly opposite the first group wherein the occupied status is fulfilled if at least one of the child nodes of the first group or second group, respectively, is not empty.

In embodiments of the encoding or decoding method, if the first group is occupied and the second group is not occupied, the planar information is entropy encoded/decoded with the planar context information that includes the likelihood of a "low" plane.

In embodiments of the encoding or decoding method, if the first group is not occupied and the second group is occupied, the planar information is entropy coded/decoded with the planar context information that includes the likelihood of a "high" plane.

In embodiments of the encoding or decoding method, if the first group is occupied and the second group is occupied, the planar information is entropy coded/decoded with the planar context information that includes the likelihood of no plane.

In embodiments of the encoding or decoding method, if the first group is not occupied and the second group is not occupied, the planar information is entropy coded/decoded with the planar context information that includes the likelihood of no plane.

In a preferred embodiment the method for encoding/decoding a point cloud to generate a bitstream of compressed point cloud data is implemented in a LIDAR (Light detection and ranging) device. The LIDAR device includes a light transmitting module and a sensor module. Therein, the light transmitting module is configured to scan the environment with laser light and an echo of the laser light reflected by objects in the environment is measured with a sensor of the sensor module. Further, the LIDAR device includes an evaluation module configured to determine a 3D representation of the environment in a point cloud preferably by differences in laser return times and/or wavelengths of the reflected laser light. Thereby, the echo may include up to millions of points of position information of the objects or environment resulting in large point clouds increasing the demands on computational devices to further process or evaluating this point clouds. In certain applications such as autonomous driving, processing of the LIDAR point cloud must be almost in real-time due to safety requirements. Thus, efficient and accurate compression of the point could data is necessary. Therefore, the LIDAR device may includes an encoder including a processor and a memory storage device. The memory storage device may store a computer program or application containing instructions that, when executed, cause the processor to perform operations such as those described herein. For example, the instructions may encode and output bitstreams encoded in accordance with the methods described herein. Additionally or alternatively the LIDAR device may includes a decoder including a processor and a memory storage device. The memory storage device may include a computer program or application containing instructions that, when executed, cause the processor to perform operations such as those described herein. Thus, by the encoder/decoder efficient and accurate compression of the point cloud data is enabled, providing the possibility to handle the acquired point cloud data more efficiently and preferably in real-time. Preferably, the processor of the encoder and the processor of the decoder are the same. Preferably, the memory storage device of the encoder and the memory storage device of the decoder are the same. Preferably the processor of the encoder and/or decoder are further configured to further process or evaluate the point cloud even more preferably in real-time. In particular, for the example of autonomous driving, evaluation of the point cloud could include determination of obstacles in the direction of driving.

Reference is now made to FIG. 8, which shows a simplified block diagram of an example embodiment of an encoder 1100. The encoder 1100 includes a processor 1102 and a memory storage device 1104. The memory storage device 1104 may store a computer program or application containing instructions that, when executed, cause the processor 1102 to perform operations such as those described herein. For example, the instructions may encode and output bitstreams encoded in accordance with the methods described herein. It will be understood that the instructions may be stored on a non-transitory computer-readable medium, such as a compact disc, flash memory device, random access memory, hard drive, etc. When the instructions are executed, the processor 1102 carries out the operations and functions specified in the instructions so as to operate as a special-purpose processor that implements the described process(es). Such a processor may be referred to as a "processor circuit" or "processor circuitry" in some examples.

Figure 9:
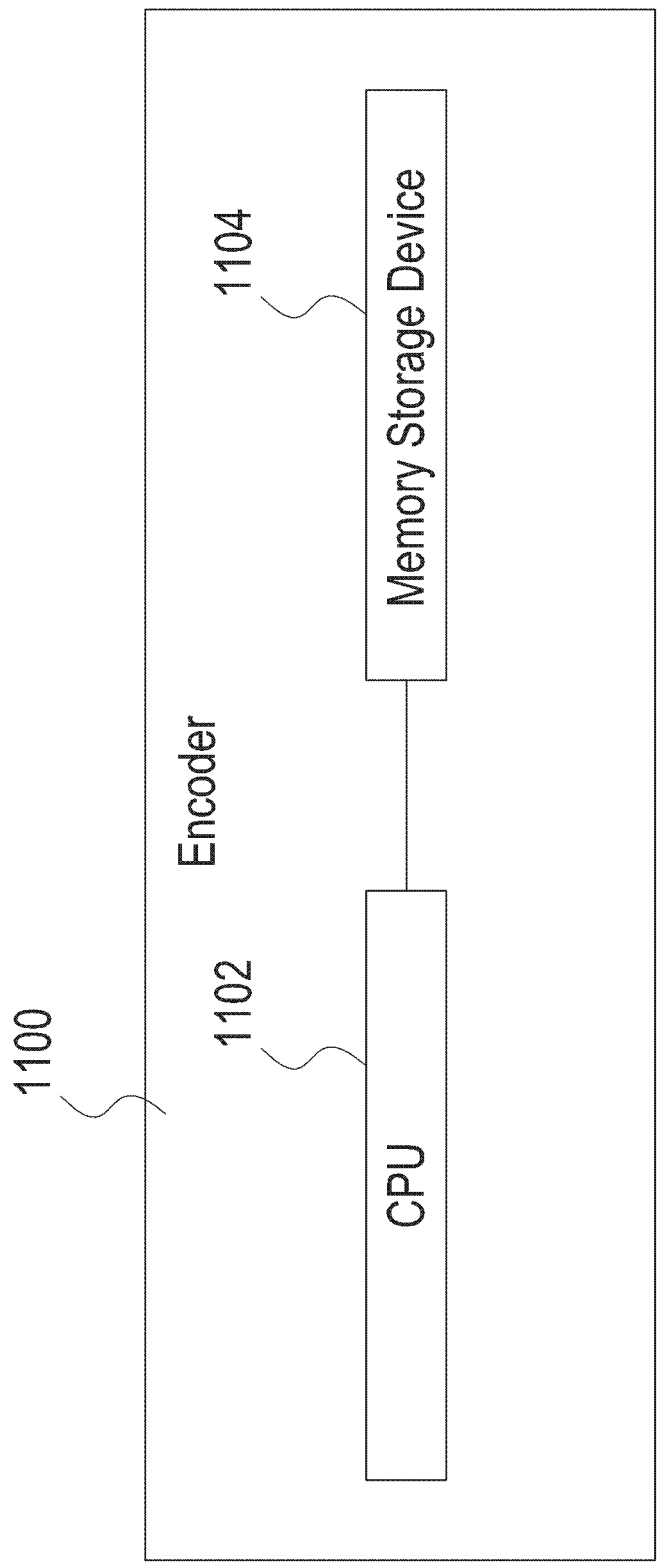
Figure 10:
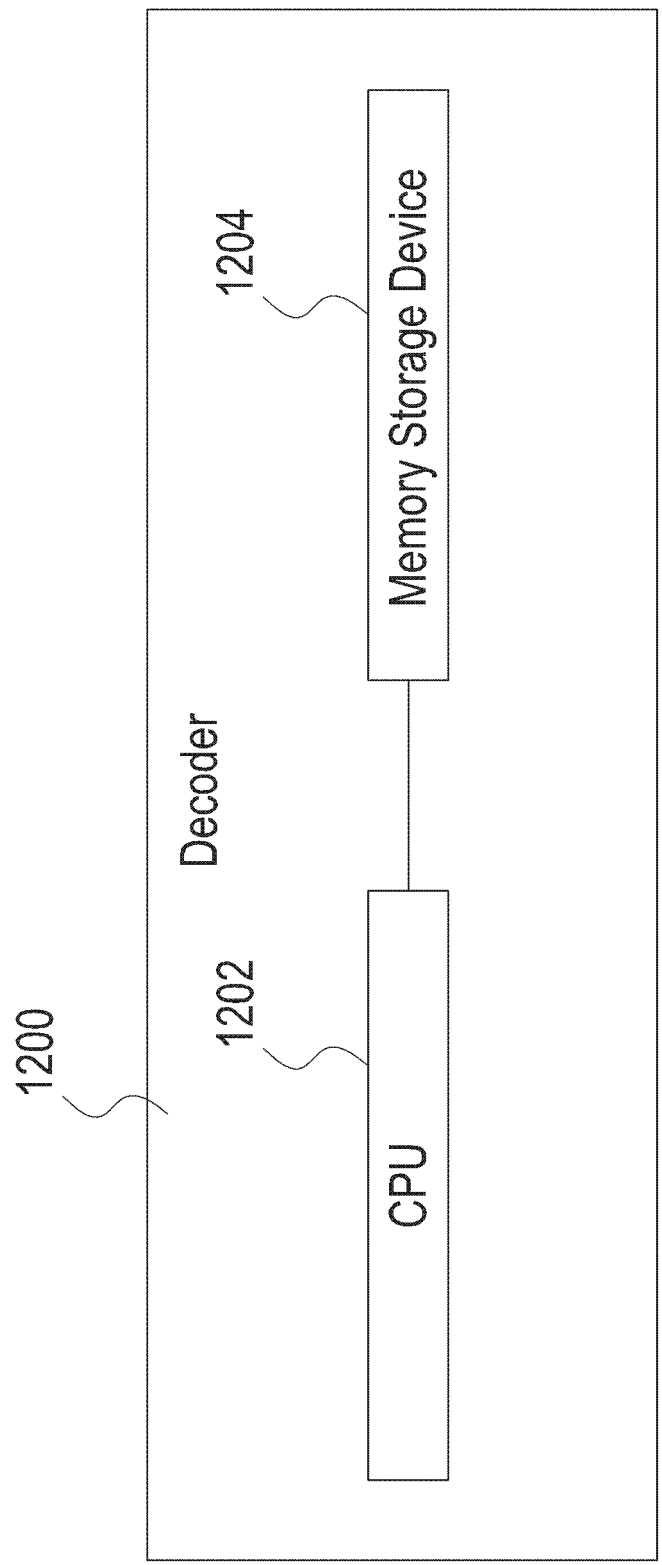

Reference is now also made to FIG. 9, which shows a simplified block diagram of an example embodiment of a decoder 1200. The decoder 1200 includes a processor 1202 and a memory storage device 1204. The memory storage device 1204 may include a computer program or application containing instructions that, when executed, cause the processor 1202 to perform operations such as those described herein. It will be understood that the instructions may be stored on a computer-readable medium, such as a compact disc, flash memory device, random access memory, hard drive, etc. When the instructions are executed, the processor 1202 carries out the operations and functions specified in the instructions so as to operate as a special-purpose processor that implements the described process(es) and methods. Such a processor may be referred to as a "processor circuit" or "processor circuitry" in some examples.

It will be appreciated that the decoder and/or encoder according to the present application may be implemented in a number of computing devices, including, without limitation, servers, suitably programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Certain adaptations and modifications of the described embodiments can be made. Therefore, the above discussed embodiments are considered to be illustrative and not restrictive. In particular, embodiments can be freely combined with each other.

The invention claimed is:

1. A method for encoding a point cloud to generate a bitstream of compressed point cloud data, wherein the point cloud's geometry is represented by an octree-based structure with a plurality of nodes having parent-child relationships by recursively splitting a volumetric space containing the point cloud into sub-volumes each associated with a node of the octree-based structure, comprising the steps:
   determining an occupancy pattern for a parent node based on the occupancy of its child nodes;
   determining planar context information for at least one of the child nodes, wherein the planar context information of a present child node is determined according to the occupancy pattern of the present parent node and the occupancy pattern of at least one neighboring parent node positioned directly next to the present parent node; and
   entropy encoding the occupancy pattern of the parent node based on the determined planar context information to produce encoded data for the bitstream.

2. The method according to claim 1, characterized in that the neighboring parent node is a node directly next to present current child node, sharing one surface with the present child node.

3. The method according to claim 1, characterized in that the neighboring parent node is arranged along one of geometrical axes.

4. The method according to claim 1, characterized in that the planar context information is determined along all three geometrical axes.

5. The method according to claim 1, characterized in that the present parent node is arranged relatively to the neighboring parent node in order of decoding.

6. The method according to claim 1, characterized in that the occupancy pattern for the present child node comprises planar information, wherein the planar information comprises isPlanar information and planePosition information, and the planar context information for the entropy encoding of the planar information includes context information indicating a likelihood that the present child node belongs to a surface defined by points of the point cloud and a likely position of the plane within the present child node.

7. The method according to claim 6, characterized in that the planar context information is determined according to an occupied status of a first group of four child nodes of the neighboring parent node that are directly next to the present parent node and an occupied status of a second group of four child nodes of the present parent node directly opposite the first group, wherein the occupied status is fulfilled if at least one of the child nodes of the first group or second group, respectively, is not empty.

8. The method according to claim 7, characterized in that if the first group is occupied and the second group is not occupied, the planar information is entropy encoded with the planar context information that includes the likelihood of a "low" plane; or
   if the first group is not occupied and the second group is occupied, the planar information is entropy coded with the planar context information that includes the likelihood of a "high" plane; or if the first group is occupied and the second group is occupied, the planar information is entropy coded with the planar context information that includes the likelihood of no plane; or if the first group is not occupied and the second group is not occupied, the planar information is entropy coded with the planar context information that includes the likelihood of no plane.

9. A method for decoding a bitstream of compressed point cloud data to generate a reconstructed point cloud, wherein the point cloud's geometry is represented by an octree-based structure with a plurality of nodes having parent-child relationships by recursively splitting a volumetric space containing the point cloud into sub-volumes each associated with a node of the octree-bases structure, comprising the steps:

entropy decoding the bitstream based on planar context information of a present child node, wherein the planar context information of the present child node is determined according to an occupancy pattern of a present parent node and an occupancy pattern of at least one neighboring parent node positioned directly next to the present parent node.

10. The method according to claim 9, characterized in that the neighboring parent node is the node directly next to the current child node, sharing one surface with the current child node.

11. The method according to claim 9, characterized in that the neighboring parent node is arranged along one of geometrical axes.

12. The method according to claim 9, characterized in that the planar context information is determined along all three geometrical axes.

13. The method according to claim 9, characterized in that the present parent node is arranged relatively to the neighboring parent node in order of decoding.

14. The method according to claim 9, characterized in that the occupancy pattern for the present child node comprises planar information, wherein the planar information comprises isPlanar information and planePosition information, and the planar context information for the entropy decoding of the planar information includes context information indicating a likelihood that the present child node belongs to a surface defined by points of the point cloud and a likely position of the plane within the present child node.

15. The method according to claim 14, characterized in that the planar context information is determined according to an occupied status of a first group of four child nodes of the neighboring parent node that are directly next to the present parent node and an occupied status of a second group of four child nodes of the present parent node directly opposite the first group, wherein the occupied status is fulfilled if at least one of the child nodes of the first group or second group, respectively, is not empty.

16. The method according to claim 15, characterized in that if the first group is occupied and the second group is not occupied, the planar information is entropy decoded with the planar context information that includes the likelihood of a "low" plane; or if the first group is not occupied and the second group is occupied, the planar information is entropy decoded with the planar context information that includes the likelihood of a "high" plane; or if the first group is occupied and the second group is occupied, the planar information is entropy decoded with the planar context information that includes the likelihood of no plane; or if the first group is not occupied and the second group is not occupied, the planar information is entropy decoded with the planar context information that includes the likelihood of no plane.

17. An encoder for encoding a point cloud to generate a bitstream of compressed point cloud data, wherein the point cloud's geometry is represented by an octree-based structure with a plurality of nodes having parent-child relationships by recursively splitting a volumetric space containing the point cloud into sub-volumes each associated with a node of the octree-based structure, the encoder comprising:

a processor and a memory storage device, wherein in the memory storage device instructions executable by the processor are stored that, when executed, cause the processor to perform the following:

determining an occupancy pattern for a parent node based on the occupancy of its child nodes;

determining planar context information for at least one of the child nodes, wherein the planar context information of a present child node is determined according to the occupancy pattern of the present parent node and the occupancy pattern of at least one neighboring parent node positioned directly next to the present parent node; and entropy encoding the occupancy pattern of the parent node based on the determined planar context information to produce encoded data for the bitstream.

18. A decoder for decoding a bitstream of compressed point cloud data to generate a reconstructed point cloud, wherein the point cloud's geometry is represented by an octree-based structure with a plurality of nodes having parent-child relationships by recursively splitting a volumetric space containing the point cloud into sub-volumes each associated with a node of the octree-bases structure, the decoder comprising:

a processor and a memory storage device, wherein in the memory storage device instructions executable by the processor are stored that, when executed, cause the processor to perform the method according to claim 9.

* * * * *